(12) United States Patent
Shah et al.

(10) Patent No.: US 12,127,370 B2
(45) Date of Patent: Oct. 22, 2024

(54) ELECTRONIC EQUIPMENT CHASSIS WITH HYBRID COOLING COMPARTMENTS

(71) Applicant: Dell Products L.P., Round Rock, TX (US)

(72) Inventors: Maunish A. Shah, Austin, TX (US); Shree Rathinasamy, Round Rock, TX (US); David Piehler, Mountain View, CA (US)

(73) Assignee: Dell Products L.P., Round Rock, TX (US)

( * ) Notice: Subject to any disclaimer, the term of this patent is extended or adjusted under 35 U.S.C. 154(b) by 310 days.

(21) Appl. No.: 17/570,494

(22) Filed: Jan. 7, 2022

(65) Prior Publication Data

US 2023/0225076 A1    Jul. 13, 2023

(51) Int. Cl.
*H05K 7/20* (2006.01)
*H05K 7/14* (2006.01)

(52) U.S. Cl.
CPC ....... *H05K 7/20236* (2013.01); *H05K 7/1491* (2013.01); *H05K 7/20263* (2013.01); *H05K 7/20272* (2013.01); *H05K 7/20781* (2013.01)

(58) Field of Classification Search
CPC ............. H05K 7/20236; H05K 7/1491; H05K 7/20263; H05K 7/20272; H05K 7/20781; H05K 7/20736; H05K 7/203; H05K 7/20772; G06F 1/20
See application file for complete search history.

(56) References Cited

U.S. PATENT DOCUMENTS

| 6,156,970 | A * | 12/2000 | Harting | H05K 7/203 174/547 |
| 7,475,494 | B1 * | 1/2009 | Knight | H05K 7/1425 361/698 |
| 9,144,179 | B2 * | 9/2015 | Shelnutt | H05K 7/20809 |
| 10,667,434 | B1 * | 5/2020 | Mao | H05K 7/20772 |
| 10,925,188 | B1 * | 2/2021 | Keehn | H05K 7/20318 |
| 10,939,581 | B1 * | 3/2021 | Chen | H05K 7/20781 |
| 2015/0334880 | A1 * | 11/2015 | Best | H05K 7/20836 361/679.47 |
| 2017/0156233 | A1 * | 6/2017 | Moss | H05K 7/20236 |
| 2017/0181325 | A1 * | 6/2017 | Shelnutt | H05K 7/20272 |
| 2022/0322577 | A1 * | 10/2022 | Bauchart | H05K 7/20809 |

(Continued)

OTHER PUBLICATIONS

Green Revolution Cooling, Inc. "Operational Considerations for Single-Phase, Immersion-Cooled Data Centers: A Client's Perspective," Guide, 2021, 9 pages.

(Continued)

*Primary Examiner* — Stephen S Sul
(74) *Attorney, Agent, or Firm* — Ryan, Mason & Lewis, LLP

(57) ABSTRACT

An electronic equipment chassis comprises a chassis housing and two or more cooling compartments in the chassis housing. At least a first one of the two or more cooling compartments in the chassis housing utilizes a first type of cooling for a first set of electronic equipment housed therein, and at least a second one of the two or more cooling compartments in the chassis housing utilizes a second type of cooling for a second set of electronic equipment housed therein. The first type of cooling comprises liquid immersion cooling and the second type of cooling comprises non-liquid immersion cooling.

20 Claims, 12 Drawing Sheets

(56) References Cited

U.S. PATENT DOCUMENTS

| | | | |
|---|---|---|---|
| 2023/0022650 A1* | 1/2023 | Lin | H05K 7/20327 |
| 2023/0052701 A1* | 2/2023 | Chen | H05K 7/20236 |
| 2023/0156961 A1* | 5/2023 | Yuan | H05K 7/203 |
| | | | 361/700 |
| 2023/0200025 A1* | 6/2023 | Gao | H05K 7/1489 |
| | | | 361/700 |

OTHER PUBLICATIONS

Green Revolution Cooling, Inc. "ElectroSafe Single-Phase Liquid Coolants," Fact Sheet, 2021, 2 pages.
Amax, "Pushing Operational Limits and Efficiencies with Liquid Immersion Cooling," Solution Brief, 2019, 2 pages.
P. E. Tuma, "Open Bath Immersion Cooling: Density, Efficiency and Simplicity," https://multimedia.3m.com/mws/media/910896O/datacenter-dynamics-paris-obi-cooling.pdf, Jun. 5, 2012, 28 pages.
L. Dymyd et al., "Design Guidelines for Immersion-Cooled IT Equipment," OPEN Compute Project, Revision 1.0, https://www.opencompute.org/documents/design-guidelines-for-immersion-cooled-it-equipment-revision-1-01-pdf, Dec. 7, 2020, 41 pages.

* cited by examiner ic ELECTRONIC EQUIPMENT CHASSIS WITH HYBRID COOLING COMPARTMENTS

FIELD

The field relates generally to electronic equipment, and more particularly to chassis configurations for such electronic equipment.

BACKGROUND

A given set of electronic equipment configured to provide desired system functionality is often installed in a chassis. Such equipment can include, for example, various arrangements of storage devices, memory modules, processors, circuit boards, interface cards and power supplies used to implement at least a portion of a storage system, a multi-blade server system or other type of information processing system.

The chassis typically complies with established standards of height, width and depth to facilitate mounting of the chassis in an equipment cabinet or other type of equipment rack. For example, standard chassis heights such as 1U, 2U, 3U, 4U and so on are commonly used, where U denotes a unit height of 1.75 inches (1.75") in accordance with the well-known EIA-310-D industry standard.

SUMMARY

Illustrative embodiments of the present disclosure provide techniques for hybrid cooling of electronic equipment in different compartments of an electronic equipment chassis.

In one embodiment, an electronic equipment chassis comprises a chassis housing and two or more cooling compartments in the chassis housing. At least a first one of the two or more cooling compartments in the chassis housing utilizes a first type of cooling for a first set of electronic equipment housed therein, and at least a second one of the two or more cooling compartments in the chassis housing utilizes a second type of cooling for a second set of electronic equipment housed therein. The first type of cooling comprises liquid immersion cooling and the second type of cooling comprises non-liquid immersion cooling.

In another embodiment, a liquid immersion module comprises a liquid immersion container configured to house a set of electronic equipment, one or more rail guides coupled to the liquid immersion container, the one or more rail guides configured for facilitating insertion and removal of the liquid immersion module from a liquid immersion cooling compartment of an electronic equipment chassis, and one or more cable management features configured for routing of one or more cables interconnecting the set of electronic equipment in the liquid immersion container with additional electronic equipment external to the electronic equipment chassis.

In another embodiment, an electronic equipment rack comprises at least one electronic equipment chassis comprising a chassis housing with two or more cooling compartments including at least a first cooling compartment utilizing liquid immersion cooling for a first set of electronic equipment and at least a second cooling compartment utilizing non-liquid immersion cooling for a second set of electronic equipment. The electronic equipment rack also comprises at least one liquid immersion module configured for insertion into and removal from the at least one cooling compartment of the at least one electronic equipment chassis, the at least one liquid immersion module comprising at least one liquid immersion container configured to house the first set of electronic equipment.

These and other illustrative embodiments include, without limitation, methods, apparatus, networks, systems and processor-readable storage media.

DETAILED DESCRIPTION

Figure 1:
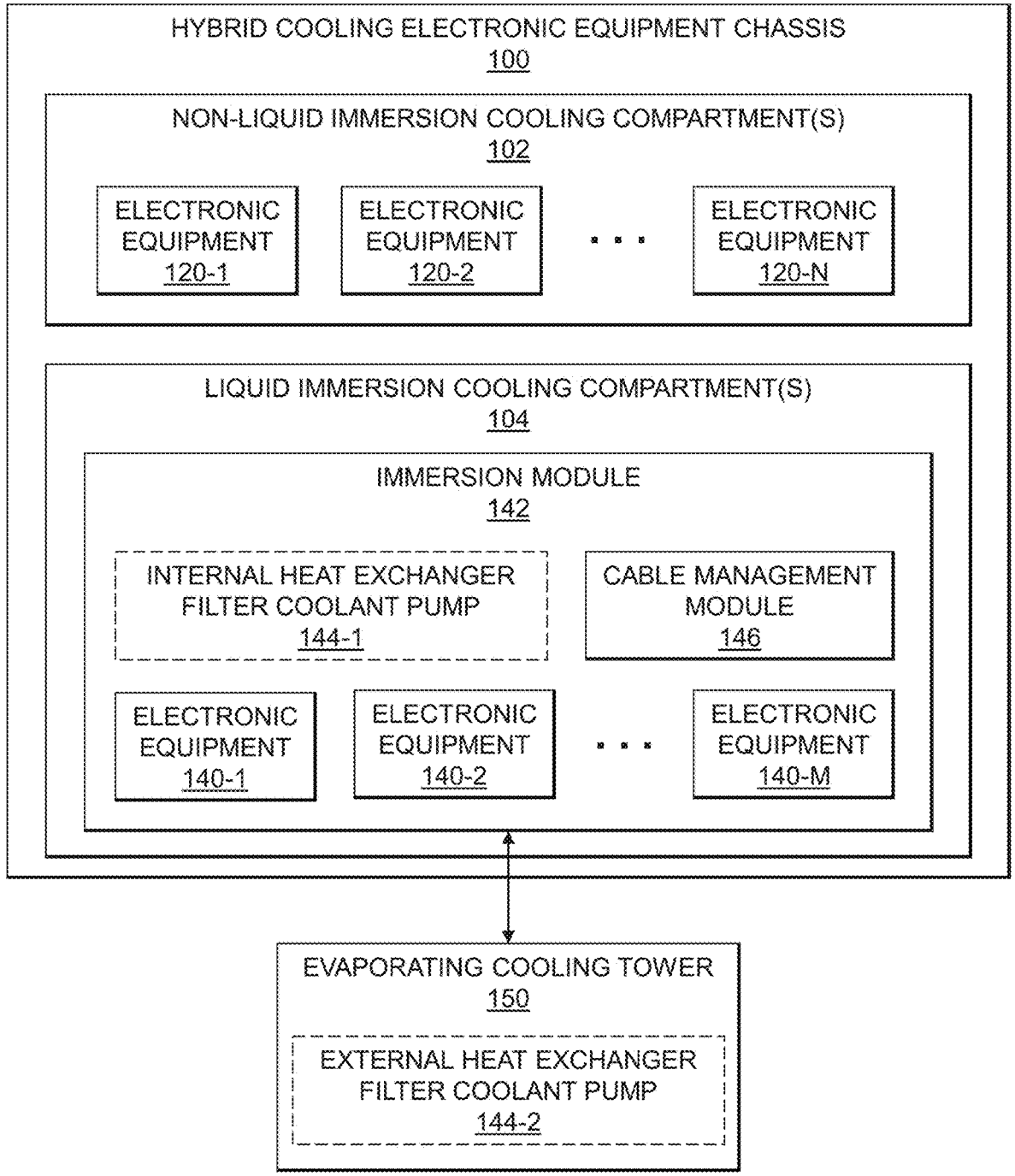
FIG. 1 shows a hybrid cooling electronic equipment chassis configured with liquid immersion and non-liquid immersion cooling compartments in an illustrative embodiment.

Illustrative embodiments will be described herein with reference to exemplary chassis configurations for electronic equipment such as servers, storage systems, etc. It is to be appreciated, however, that embodiments of the invention are not restricted to the particular illustrative configurations shown. Accordingly, terms such as "electronic equipment chassis" as used herein are intended to be broadly construed, so as to encompass, for example, a wide variety of other arrangements of other types of computing devices or other electronic equipment, possibly arranged with other types of electrical equipment in a common housing of an electronic equipment chassis.

Information technology (IT) equipment, such as various compute, network and storage hardware or other electronic equipment, is typically installed in an electronic equipment chassis. The electronic equipment chassis may form part of an equipment cabinet (e.g., a computer cabinet) or equipment rack (e.g., a computer or server rack, also referred to herein simply as a "rack") that is installed in a data center, computer room or other facility. Equipment cabinets or racks provide or have physical electronic equipment chassis that can house multiple pieces of equipment, such as multiple computing devices (e.g., servers, storage systems, network devices, etc.). As noted above, an electronic equipment chassis typically complies with established standards of height, width and depth to facilitate mounting of electronic equipment in an equipment cabinet or other type of equipment rack. For example, standard chassis heights such as 1U, 2U, 3U, 4U and so on are commonly used, where U denotes a unit height of 1.75 inches (1.75") in accordance with the well-known EIA-310-D industry standard.

With continued information technology (IT) modernization, data centers and other types of information processing systems provide support for IT assets with higher processing power, increased network bandwidth, etc. Such IT assets may include, but are not limited to, various physical computing hardware such as servers, storage systems, networking equipment, other types of processing and computing devices, etc. IT assets are examples of what is more generally referred to herein as "electronic equipment" that are installed in an electronic equipment chassis that forms or provides part of an electronic equipment rack.

To support such higher processing power and increased network bandwidth, among other features, electronic equipment faces many thermal challenges. Cooling requirements for the electronic equipment (as well as the electronic equipment chassis housing such electronic equipment, and the data center or other facility in which the electronic equipment chassis is placed) are becoming more vital. Various types of cooling methods may be utilized, including air cooling, liquid cooling, and liquid immersion cooling. Most if not all electronic equipment in a typical data center utilizes air cooling methods by leveraging redundant, hot-swappable fans. Liquid cooling may also be employed, though at a higher cost than air cooling.

Air and liquid cooling methods, however, may not be sufficient for certain use cases. Some end-users, for example, may have infrastructure requirements for a set of electronic equipment that can only be met via liquid immersion cooling. Liquid immersion cooling methods may be required by certain end-users (e.g., customers and service provider organizations) for resource-intensive, high-priority and high-demand infrastructure equipment. Support for the same may also be required by major IT infrastructure equipment providers. There is thus a need for providing support for liquid immersion cooling in data centers and other facilities in which electronic equipment chassis housing such electronic equipment subject to these requirements are placed.

An electronic equipment chassis may be designed or purpose-built solely for housing or supporting liquid immersion cooling for the electronic equipment installed therein. One of the biggest challenges in taking advantage of liquid immersion cooling, however, is that a data center or other facility needs custom layouts and purpose-built rack systems that can support electronic equipment chassis which are specifically designed and purpose-built solely for liquid immersion cooling of electronic equipment. Such custom layouts and purpose-built rack systems typically demand increased "real estate" space in a data center, which increases the cost of IT operations.

Illustrative embodiments provide solutions to these and other disadvantages, through enabling the use of liquid immersion cooling in an electronic equipment chassis that is suitable for installation in any data center or other facility (e.g., in a standard rack size). Still further, the electronic equipment chassis described herein support hybrid cooling methods (e.g., both liquid immersion cooling and non-liquid immersion cooling) in the same electronic equipment chassis, overcoming disadvantages with a purpose-built electronic equipment chassis that is configured solely for housing electronic equipment that is liquid immersion cooled.

Various IT organizations seek a data center rack solution that meets the requirements of modern IT assets (e.g., thermal challenges associated with newer types of IT assets such as resource-intensive, high-priority and high-demand infrastructure equipment). The hybrid cooling electronic equipment chassis solutions described herein will enable such IT organizations to take advantage of liquid immersion cooling for multi-purpose rack solutions at small scale in any data center. Thus, any IT organization or other entity that uses, develops, manufactures or sells IT equipment racks can benefit from the hybrid cooling electronic equipment chassis solutions described herein. Data centers and other computer rooms or facilities that are ready to scale out with new racks, switches, data cables and other equipment can benefit from new rack designs which utilize the hybrid cooling electronic equipment chassis solutions described herein to take advantage of savings on cost, time, space and safety, and to provide more efficient rack management and better protection of data through optimized cooling of computing devices and other electronic equipment.

To solve the thermal challenges faced by various electronic equipment (e.g., computing devices installed in a data center, also referred to as data center devices), and to provide a small-scale solution for leveraging liquid immersion cooling in any data center or other facility, some embodiments use a multi-purpose rack system that includes an electronic equipment chassis supporting hybrid cooling methods (e.g., both liquid immersion cooling and non-liquid immersion cooling methods). In various embodiments described below, it is assumed that the hybrid cooling methods include air cooling and liquid immersion cooling. It should be appreciated, however, that an electronic equipment chassis that supports hybrid cooling methods may also support liquid cooling (e.g., in addition to or in place of air cooling).

FIG. 1 shows a hybrid cooling electronic equipment chassis 100, which includes one or more non-liquid immersion cooling compartments 102 and one or more liquid immersion cooling compartments 104. For clarity of illustration below, the hybrid cooling electronic equipment chassis 100 will be described with respect to an embodiment where there is a single non-liquid immersion cooling compartment 102 and a single liquid immersion cooling compartment 104, but it should be appreciated that this is not a requirement. The hybrid cooling electronic equipment chassis 100 may include multiple instances of the non-liquid immersion cooling compartment 102 and/or multiple instances of the liquid immersion cooling compartment 104 as desired for a particular implementation.

The non-liquid immersion cooling compartment 102 is configured to house a set of electronic equipment 120-1, 120-2, . . . 120-N (collectively, electronic equipment 120), and the liquid immersion cooling compartment 104 is configured to house a set of electronic equipment 140-1, 140-2, . . . 140-M (collectively, electronic equipment 140). The electronic equipment 120 and 140 may comprise various types of electronic equipment, including various computing devices such as servers, storage systems, network devices, etc. In some embodiments, the non-liquid immersion cooling compartment 102 is assumed to comprise an air cooled compartment of the hybrid cooling electronic equipment chassis 100. In other embodiments, however, the non-liquid immersion cooling compartment 102 comprises a liquid cooled compartment, or a hybrid air and liquid cooled compartment.

The liquid immersion cooling compartment 104 comprises a removable immersion module 142, which is assumed to comprise a thermally conductive liquid coolant (e.g., a dielectric fluid) in which the electronic equipment 140 is submerged. The immersion module 142 includes an internal heat exchanger filter coolant pump 144-1 and/or is coupled with an external heat exchanger filter coolant pump 144-2 outside of the liquid immersion cooling compartment 104. In the FIG. 1 embodiment, the external heat exchanger filter coolant pump 144-2 is shown as being part of a separate evaporating cooling tower 150 outside of the hybrid cooling electronic equipment chassis 100, but this is not a requirement. In other embodiments, the external heat exchanger filter coolant pump 144-2 may be part of the hybrid cooling electronic equipment chassis 100, but outside of the immersion module 142 and/or liquid immersion cooling compartment 104. The immersion module 142 is further configured with a cable management module 146, which provides various features for cable management of the electronic equipment 140 that is housed within the immersion module 142. The cable management module 146 may include, for example, one or more cable ducts or cable routing management features for connecting the electronic equipment 140 to one another, to power distribution units (PDUs), and/or to other electronic equipment (e.g., the electronic equipment 120 in the non-liquid immersion cooling compartment 102 of the hybrid cooling electronic equipment chassis 100, to other equipment outside of the hybrid cooling electronic equipment chassis 100, etc.).

FIGS. 2A-2E show different views of an exemplary hybrid cooling electronic equipment chassis embodied as a data center rack 200. The data center rack 200, as illustrated in the side view of FIG. 2A, includes an air-cooled compartment 202 and a liquid immersion-cooled compartment 204. The air-cooled compartment 202 is an example of a non-liquid immersion-cooled compartment. It should be noted that in some embodiments the air-cooled compartment 202 may be replaced with a liquid-cooled compartment, or a combined air-cooled and liquid-cooled compartment. While in the embodiment of FIGS. 2A-2E the air-cooled compartment 202 is "above" the liquid immersion-cooled compartment 204, this is not a requirement. In other embodiments, the liquid immersion-cooled compartment 204 need not be at a bottom of the data center rack 200. Still further, the data center rack 200 is not limited solely to having two compartments. There may be three or more compartments, with at least one of such compartments utilizing liquid immersion cooling and at least one of such compartments not utilizing liquid immersion cooling. Further, a liquid immersion cooling compartment may be placed in any desired vertical location of the data center rack 200 (e.g., with one or more non-liquid immersion cooling compartments above and/or below each liquid immersion cooling compartment).

The air-cooled compartment 202 includes various electronic equipment 220 housed therein, with such electronic equipment includes a set of 1U electronic equipment 220-1 and a set of 2U electronic equipment 220-2. It should be appreciated, however, that the air-cooled compartment 202 is not required to house both 1U and 2U-sized electronic equipment. In some embodiments, only 1U or only 2U-sized electronic equipment is installed in the air-cooled compartment 202 of the data center rack 200, or various other-sized electronic equipment (e.g., 4U-sized electronic equipment) may be installed in the air-cooled compartment 202 instead of, or in addition to, the 1U electronic equipment 220-1 and/or 2U electronic equipment 220-2. It should further be noted that there may be no electronic equipment installed in the air-cooled compartment 202 of the data center rack 200. For example, electronic equipment may be installed and removed as desired from the data center rack 200, such that at some times there may be no electronic equipment installed in the air-cooled compartment 202 (or the liquid immersion-cooled compartment 204). The electronic equipment 220 is illustratively configured for insertion and removal from the front 201 of the data center rack 200. Cables or wiring for the electronic equipment 220 (and electronic equipment 240 (FIG. 2D) housed in an immersion module 242 in the liquid immersion-cooled compartment 204) may be routed through the rear 203 of the data center rack 200.

Figure 2A:
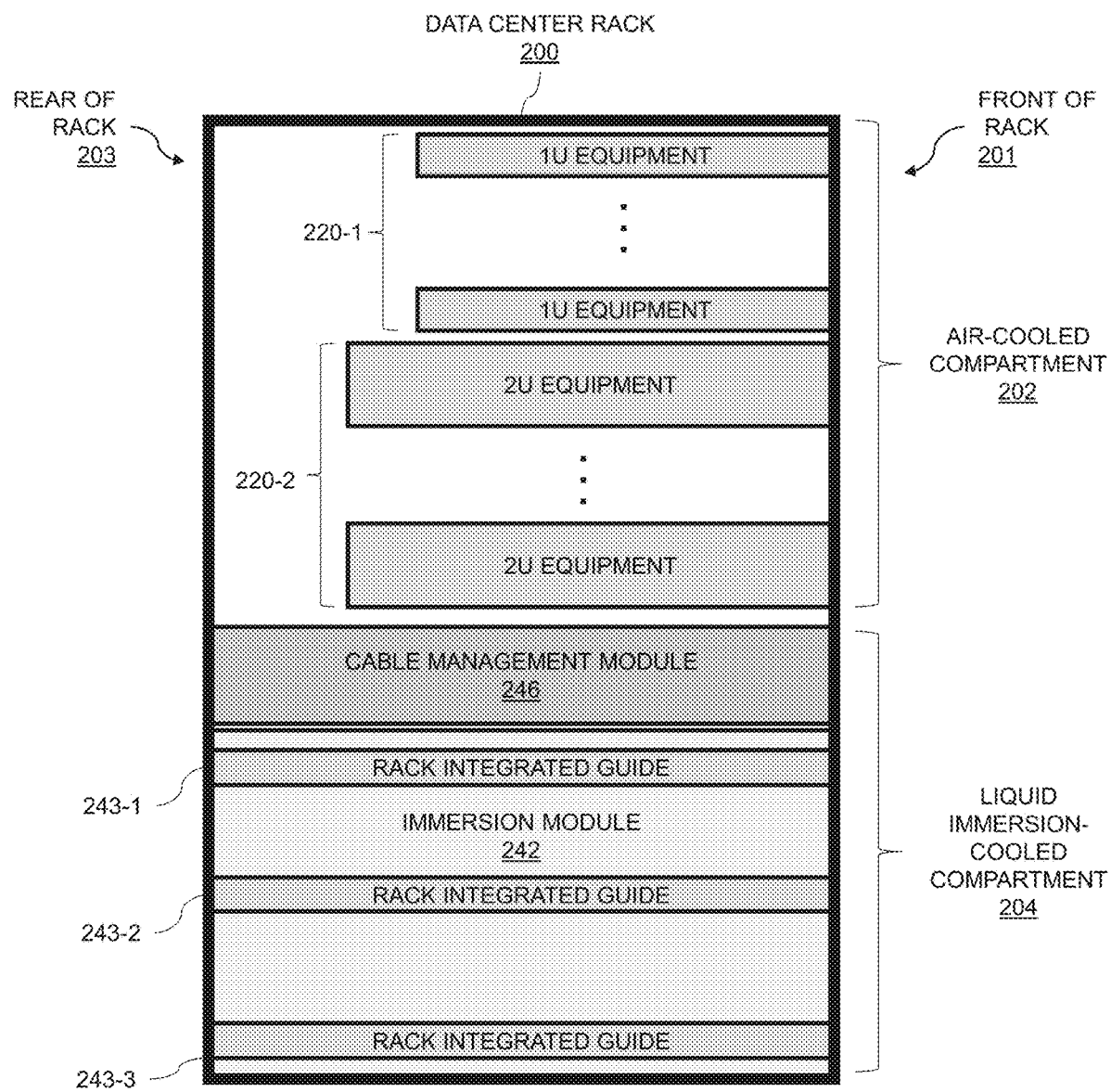
FIG. 2A shows a side view of a hybrid cooling electronic equipment chassis providing a data center rack in an illustrative embodiment.
Figure 2B:
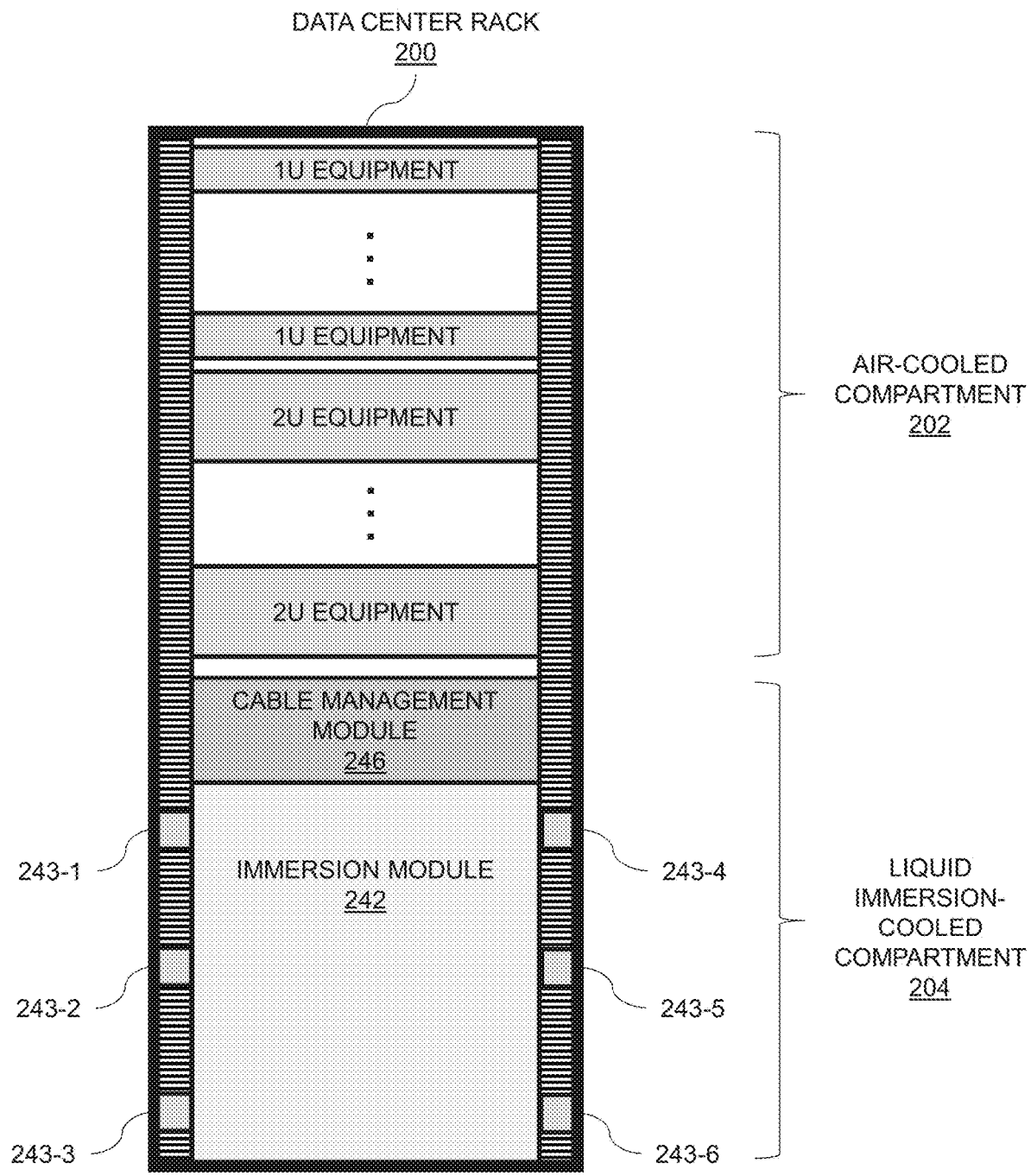
FIG. 2B shows a front view of the hybrid cooling electronic equipment chassis providing the FIG. 2A data center rack in an illustrative embodiment.

The liquid immersion-cooled compartment 204 includes the immersion module 242 which houses electronic equipment 240 (as shown and described in further detail below with respect to FIG. 2D). The immersion module 242 is configured to be inserted and removed from the liquid immersion-cooled compartment 204 of the data center rack 200 (e.g., to install or remove electronic equipment 240 therefrom). The immersion module 242 may be inserted and removed (e.g., from the front 201 of the data center rack 200) from the liquid immersion-cooled compartment 204 along a set of rack integrated guides 243-1 through 243-6 (collectively, rack integrated guides 243). In the example of FIGS. 2A-2E, there are three rack integrated guides 243 on each "side" of the data center rack 200. FIG. 2B shows a front view of the data center rack 200, illustrating a first set of rack integrated guides 243-1, 243-2 and 243-3 on a "left" side of the data center rack 200 and a second set of rack integrated guides 243-4, 243-5 and 243-6 on a "right" side of the data center rack 200. In other embodiments, however, there may be more or fewer than three rack integrated guides on each side of the data center rack 200. Further, it is not required that the same number of rack integrated guides be utilized for both sides of the data center rack 200. The rack integrated guides 243 may comprise linear slide or guide tracks, with the immersion module 242 including corresponding sliding rail components (e.g., with bearings that facilitate insertion and sliding along the tracks of the rack integrated guides 243).

The liquid immersion-cooled compartment 204 further includes a cable management module 246, which is configured to provide cable management for the electronic equipment 240 that is installed or housed in the immersion module 242 of the liquid immersion-cooled compartment 204 of the data center rack 200. The cable management module 246 may include cable management features for routing cables to and from electronic equipment 240 that is installed in the immersion module 242. Such cable routing facilitates interconnection of the electronic equipment 240 with other components of the immersion module 242 (e.g., PDUs thereof), with other components of the data center rack 200

(e.g., electronic equipment 220 in the air-cooled compartment 202), with components outside of the data center rack 200 (e.g., electronic equipment installed in other data center racks in the same or a different data center or other facility), combinations thereof, etc.

Figure 2C:
FIG. 2C shows a side view of the hybrid cooling electronic equipment chassis providing the FIG. 2A data center rack with the immersion module removed from the liquid immersion cooling compartment thereof in an illustrative embodiment.
Figure 2D:
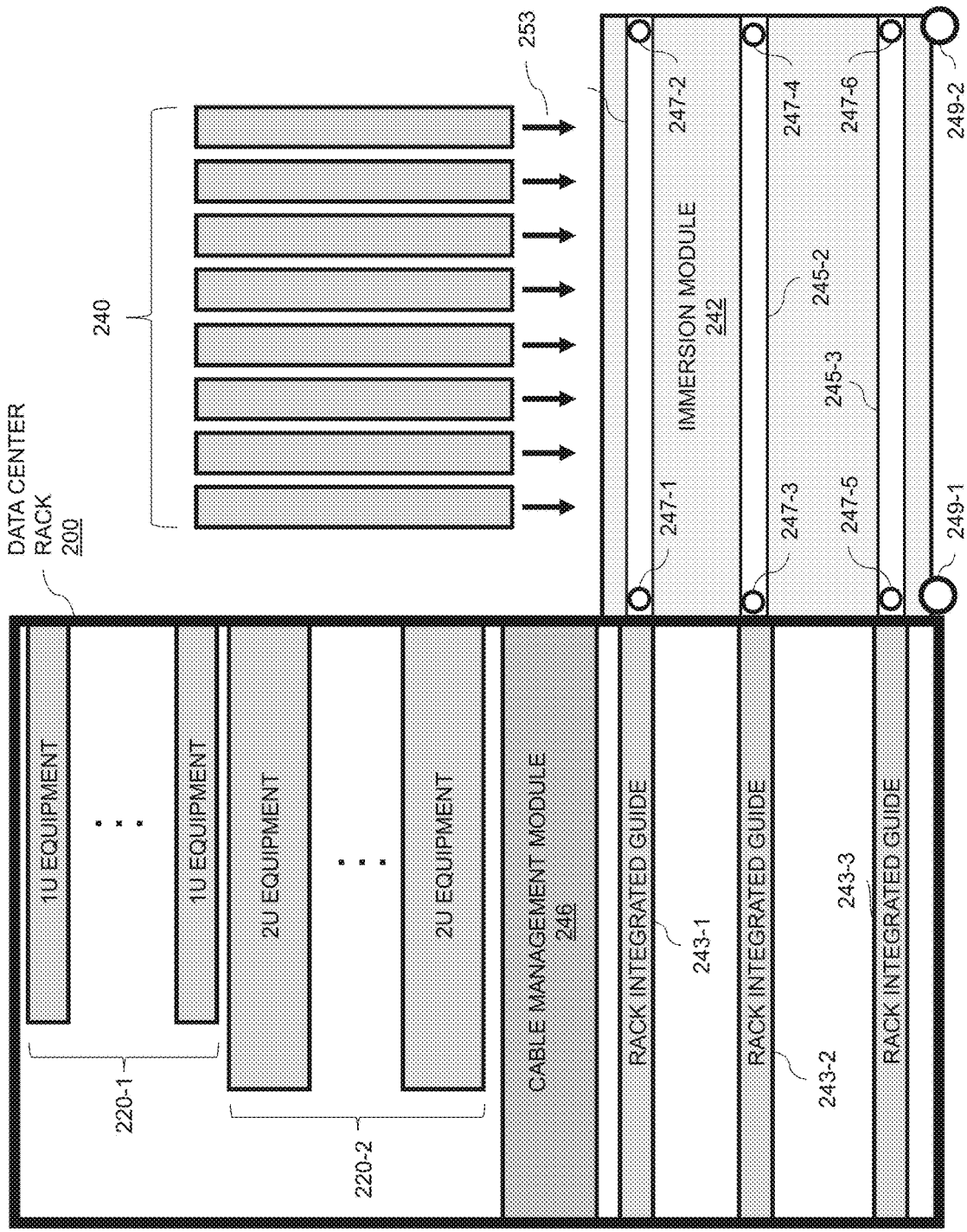
FIG. 2D shows a side view of the hybrid cooling electronic equipment chassis providing the FIG. 2A data center rack with electronic equipment being inserted into the immersion module removed from the liquid immersion cooling compartment thereof in an illustrative embodiment.

FIG. 2C shows another side view of the data center rack 200, illustrating removal 251 of the immersion module 242 from the front 201 of the data center rack 200 along the rack integrated guides 243. As shown in FIG. 2C, the immersion module 242 includes a set of rails 245-1, 245-2 and 245-3 (collectively, rails 245) that insert and slide along tracks provide by the rack integrated guides 243-1, 243-2 and 243-3, respectively. Each of the rails 245 may include one or more bearings to facilitate movement along the tracks provided by its associated one of the rack integrated guides 243-1, 243-2 and 243-3. More particularly, bearings 247-1 and 247-2 on the rail 245-1 are configured to slide along the track of rack integrated guide 243-1, bearings 247-3 and 247-4 on the rail 245-2 are configured to slide along the track of rack integrated guide 243-2, and bearings 247-5 and 247-6 on the rail 245-3 are configured to slide along the track of rack integrated guide 243-3. Although not shown in FIG. 2C, the opposite side of the immersion module 242 may also include a set of rails with bearings that are configured to slide along the tracks of rack integrated guides 243-4, 243-5 and 243-6. Further, while FIG. 2C shows an example where there are two bearings on each of the rails 245 configured to slide along the track of each of the rack integrated guides 243, in other embodiments there may be more or fewer than two bearings on each of the rails 245 that are configured to slide along the track of each of the rack integrated guides 243 to facilitate insertion and removal of the immersion module 242.

The immersion module 242 further includes a set of retractable wheels 249-1 and 249-2 (collectively, retractable wheels 249) on a bottom edge thereof to facilitate insertion and removal of the immersion module 242 from the liquid immersion-cooled compartment 204 of the data center rack 200. It should be noted that retractable wheels may also be provided on the opposite side of the immersion module 242, or at various other locations, to facilitate insertion and removal of the immersion module 242 from the liquid immersion-cooled compartment 204 of the data center rack 200. It should further be noted that the retractable wheels 249 are not required.

FIG. 2D shows another side view of the data center rack 200 with the immersion module 242 removed from the liquid immersion-cooled compartment 204 as described above with respect to FIG. 2C. FIG. 2D further shows the electronic equipment 240 being inserted 253 into the immersion module 242. The immersion module 242, as will be described in further detail below with respect to FIGS. 3A-3E, may include equipment mounts for guiding the electronic equipment 240 into designated slots or portions of the immersion module 242. The immersion module 242, as will also be described in further detail below with respect to FIGS. 3A-3E, may include cable management and routing features facilitating interconnection of the equipment 240 to the cable management module 246 and potentially other equipment (e.g., equipment 220, equipment outside of the data center rack 200, etc.).

Figure 2E:
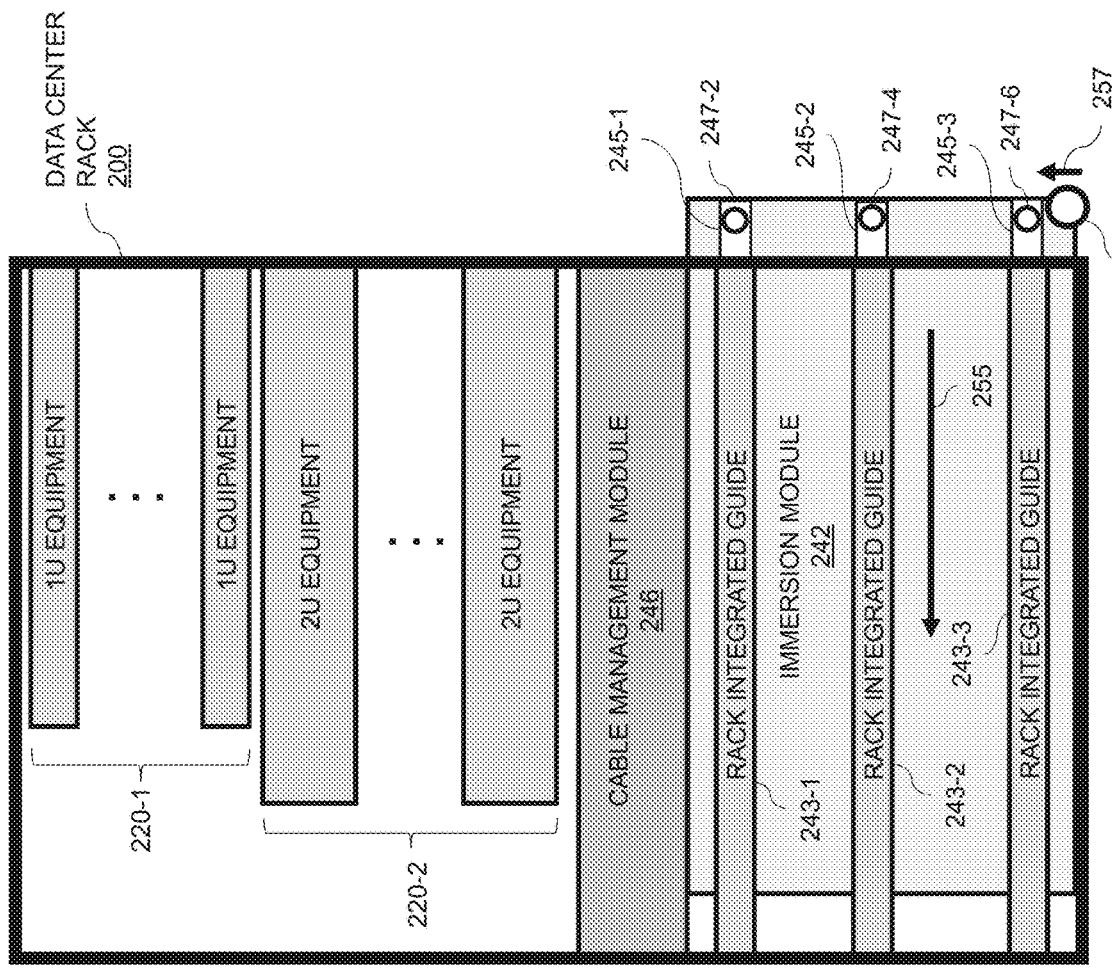
FIG. 2E shows a side view of the hybrid cooling electronic equipment chassis providing the FIG. 2A data center rack with the immersion module being inserted into the liquid immersion cooling compartment thereof in an illustrative embodiment.

FIG. 2E shows another side view of the data center rack 200 with the immersion module 242 being inserted 255 into the liquid immersion-cooled compartment 204 (e.g., after insertion of the equipment 240 in the immersion module 242 as illustrated in FIG. 2D). As illustrated in FIG. 2E, as the immersion module 242 is inserted 255 into the liquid immersion-cooled compartment 204, the retractable wheels 249 "retract" 257 (e.g., move upwards to facilitate insertion). It should be appreciated that the immersion module 242 may be inserted and removed from the liquid immersion-cooled compartment 204 of the data center rack 200 as desired to add or remove equipment therefrom.

Figure 3A:
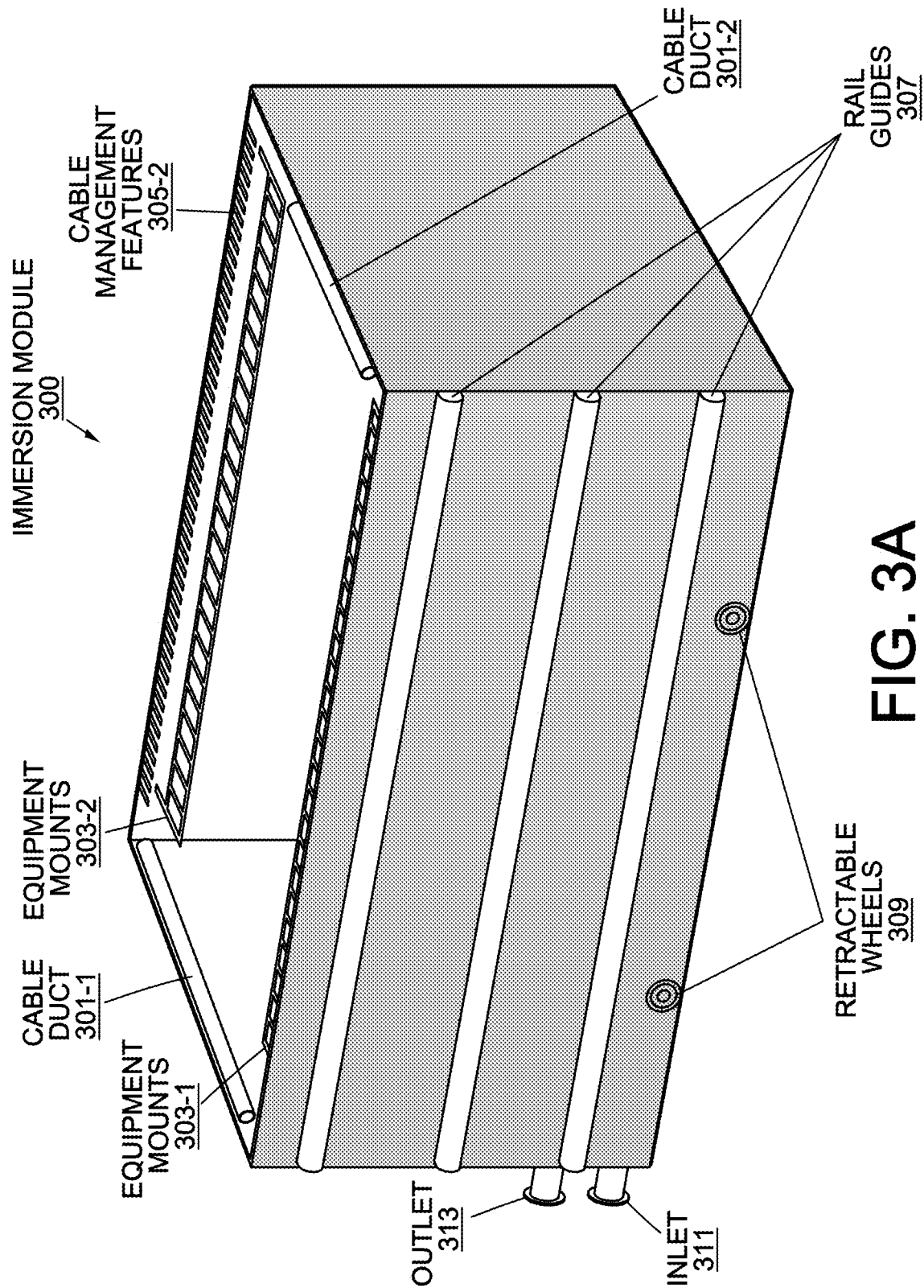
FIG. 3A shows a perspective view of an immersion module configured for insertion into a liquid immersion cooling compartment of a hybrid cooling electronic equipment chassis in an illustrative embodiment.
Figure 3B:
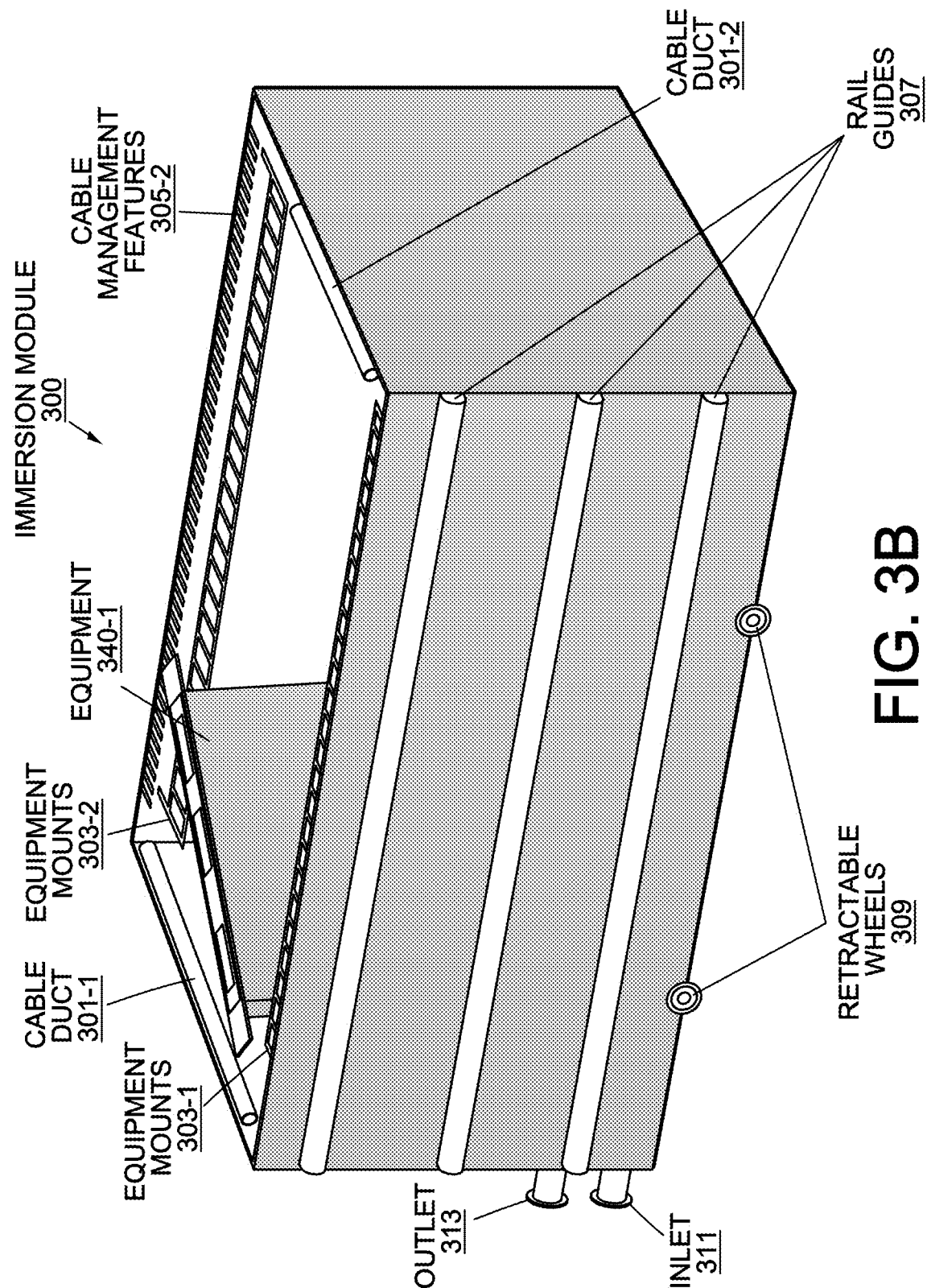
FIG. 3B shows a perspective view of electronic equipment inserted into the immersion module of FIG. 3A in an illustrative embodiment.
Figure 3C:
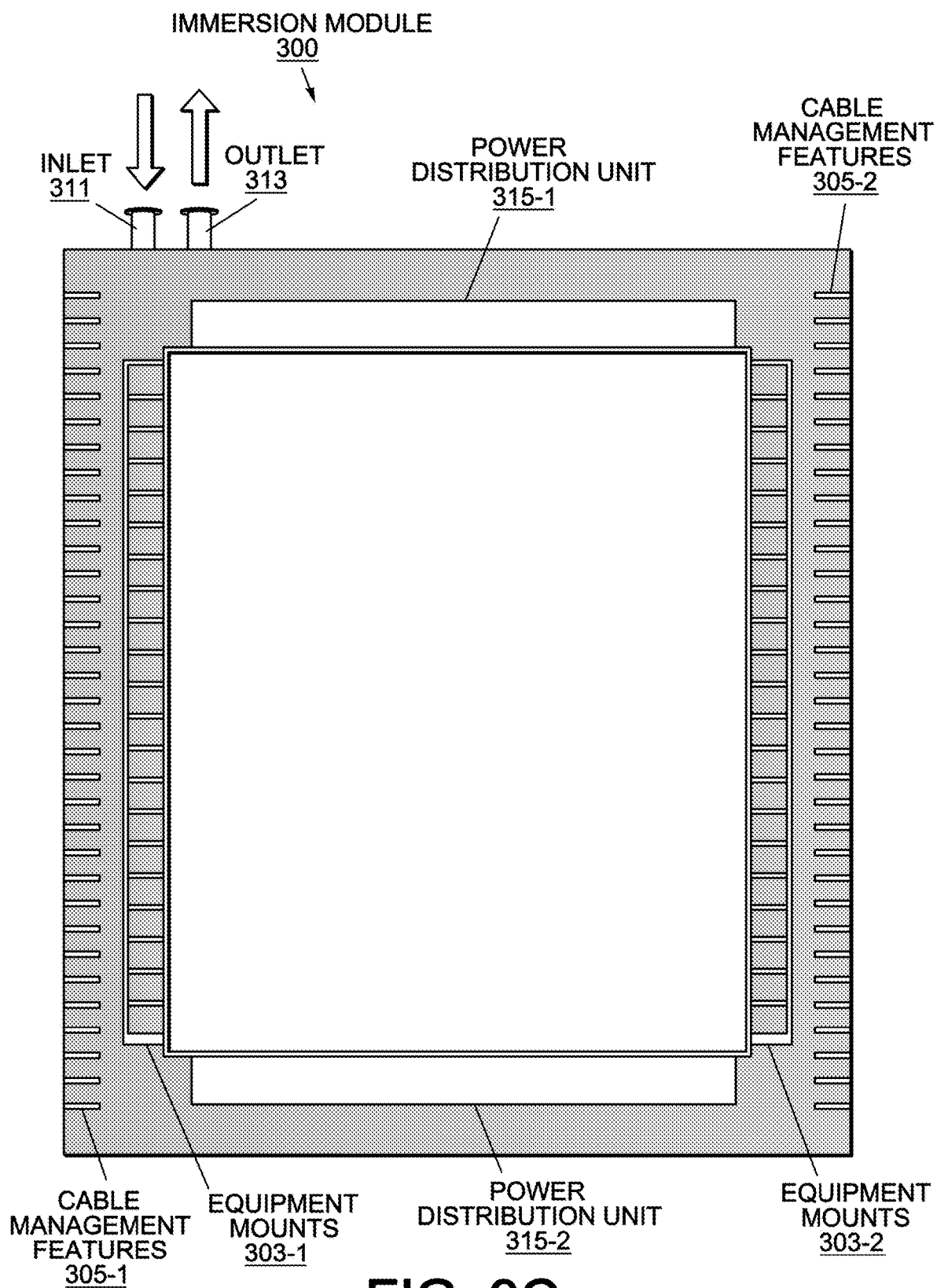
FIG. 3C shows a top view of the FIG. 3A immersion module configured with power distribution units in an illustrative embodiment.
Figure 3D:
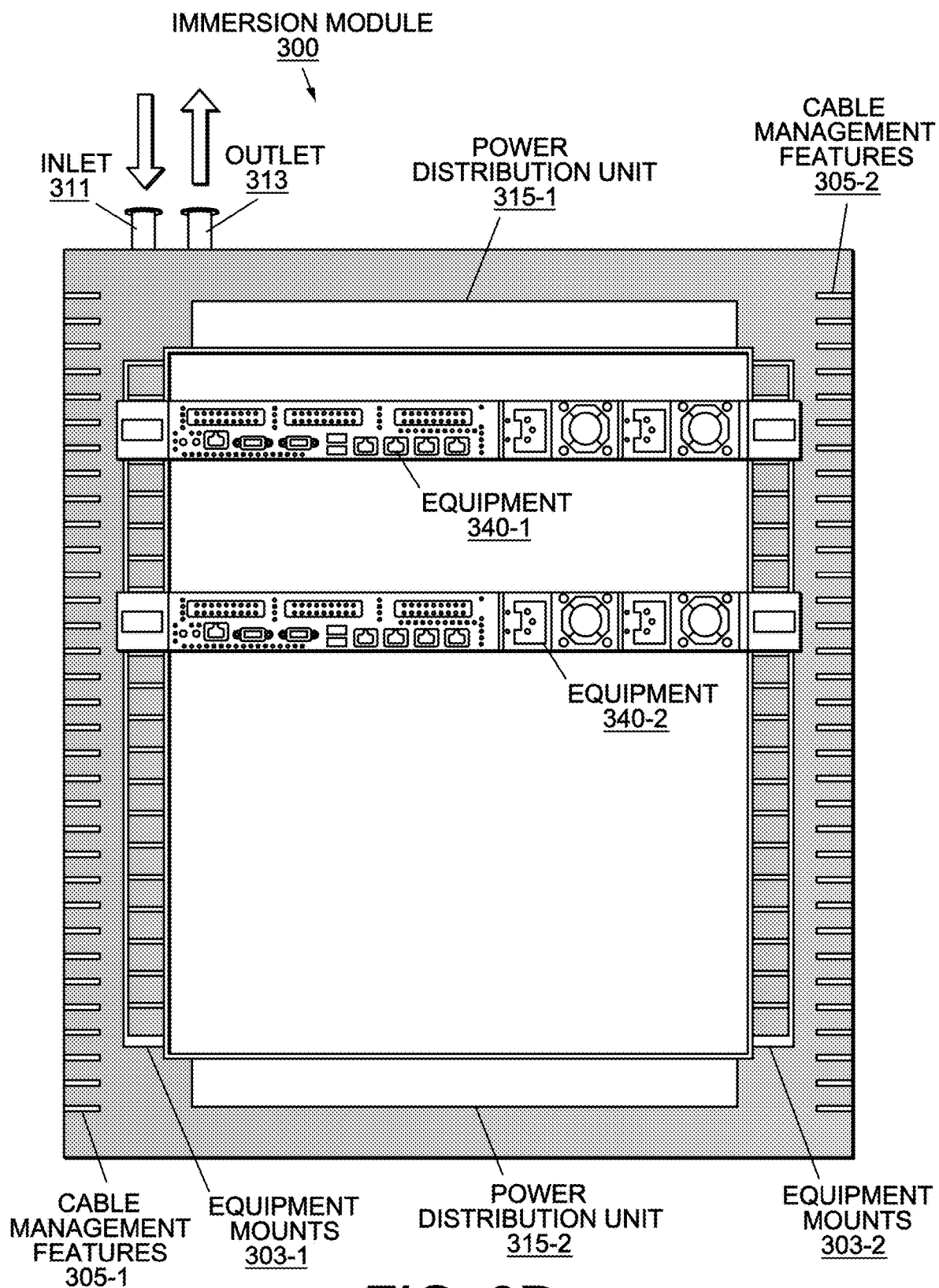
FIG. 3D shows a top view of the FIG. 3A immersion module configured with power distribution units and having electronic equipment inserted therein in an illustrative embodiment.
Figure 3E:
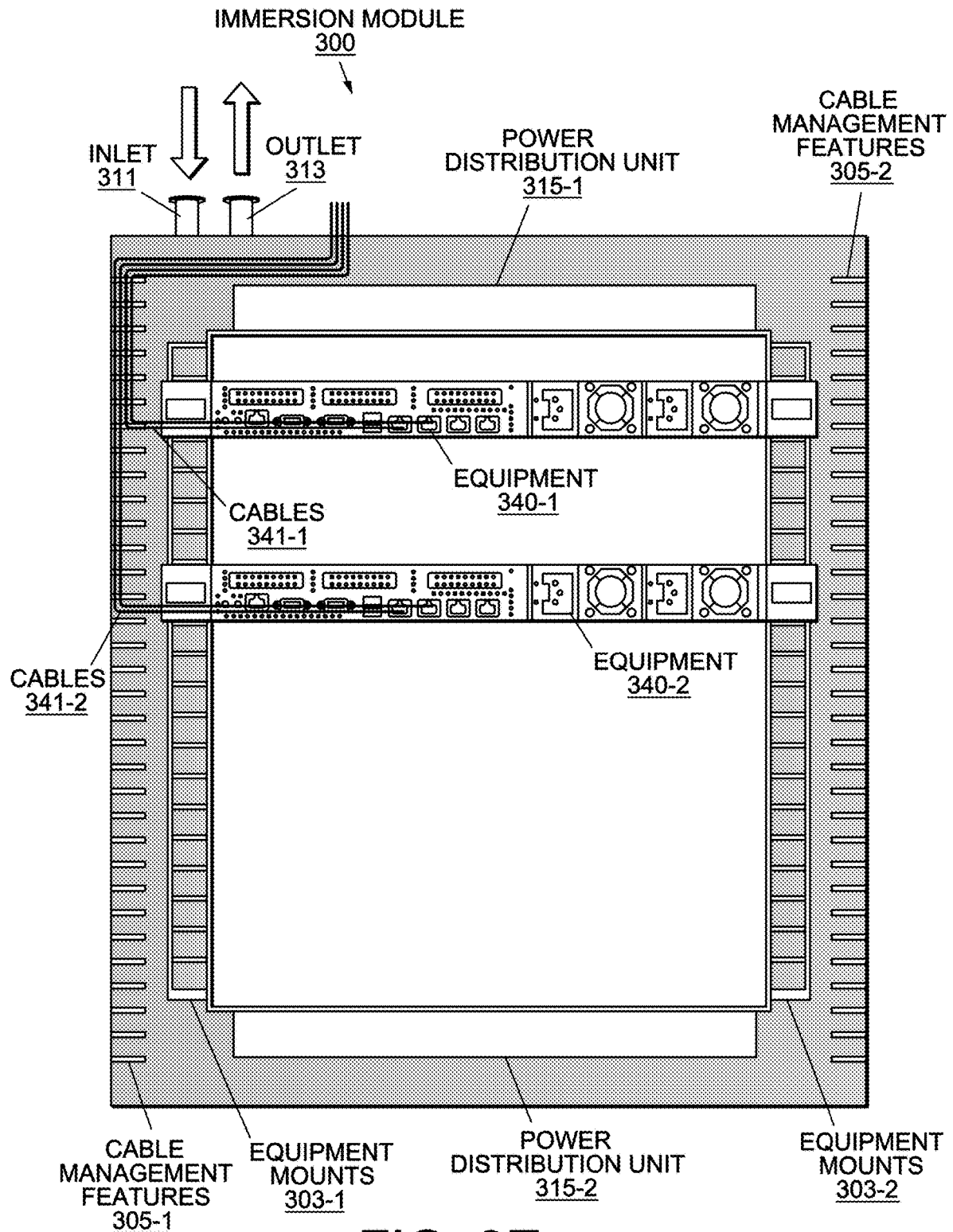
FIG. 3E shows a top view of the FIG. 3A immersion module configured with power distribution units and having electronic equipment inserted therein with cables routed via cable management features of the immersion module in an illustrative embodiment.

FIGS. 3A-3E illustrate features of an immersion module 300 configured for insertion and removal from a liquid immersion-cooled compartment of a hybrid cooling electronic equipment chassis (e.g., the liquid immersion cooling compartment 104 of hybrid cooling electronic equipment chassis 100, the liquid immersion-cooled compartment 204 of data center rack 200). The immersion module 300 shown in FIGS. 3A-3E includes cable ducts 301-1 and 301-2 (collectively, cable ducts 301), equipment mounts 303-1 and 303-2 (collectively, equipment mounts 303), cable management features 305-1 and 305-2 (collectively, cable management features 305), rail guides 307, retractable wheels 309, an inlet 311, an outlet 313, and power distribution units (PDUs) 315-1 and 315-2 (collectively, PDUs 315). FIGS. 3A and 3B show respective perspective views of the immersion module 300, with and without equipment 340-1 inserted therein. FIGS. 3C and 3D similarly show top views of the immersion module 300 with and without equipment 340-1 and 340-2 (collectively, equipment 340) installed therein. FIG. 3E shows a top view of the immersion module 300 with the equipment 340 installed therein and associated cables 341-1 and 341-2 (collectively, cable 341) routed therefrom along cable management features 305-1.

The cable ducts 301 provide for routing of cables between different sides of the immersion module 300 (e.g., between a "left" side of the immersion module 300 proximate the cable management features 305-1 and a "right" side of the immersion module 300 proximate the cable management features 305-2). The equipment mounts 303 provide slots or guides in which different pieces of equipment 340 may be inserted into the immersion module 300. The slots or guides of the equipment mounts 303 may be standard form factor sizes (e.g., 1U, 2U, etc.). The cable management features 305 may comprise or include finger-like ducts, slots or other openings providing cable guides in which cables may be inserted and routed through to different locations.

The rail guides 307 and retractable wheels 309 are configured in a manner similar to that described above with respect to the rails 245 and retractable wheels 249 of the immersion module 242. It should again be noted that the particular number of rail guides 307 and retractable wheels 309 is customizable—embodiments are not limited to use with three rail guides 307 at each side of the immersion module 300 or two retractable wheels 309 along each bottom side of the immersion module 300.

The inlet 311 and outlet 313 provide for circulation of the thermally conductive liquid (e.g., a dielectric fluid) in the immersion module 300. The inlet 311 and outlet 313 may provide at least a portion of the internal and/or external heat exchange filter coolant pumps 144-1 and 144-2 described above with respect to the hybrid cooling electronic equipment chassis 100 of FIG. 1. The liquid in the immersion module 300 may be pumped out of the immersion module 300 by the internal and/or external heat exchange filter coolant pumps 144-1 and 144-2, and may be filtered and cooled (e.g., through one or more heat exchangers) prior to being pumped back into the immersion module 300 view the inlet 311. It should be appreciated that the liquid in the immersion module 300 may be continuously cycled (e.g., pumped out via outlet 313, filtered and cooled, and pumped in via inlet 311), or may be removed and replaced (e.g., liquid is pumped out via outlet 313, and different liquid is pumped in view inlet 311), combinations thereof, etc.

The PDUs 315 are configured to route and provide power to the equipment 340 that is installed in the immersion module 300. In some embodiments, the PDUs 315 are also or alternatively configured to provide for network connectivity (e.g., switching or other network routing) for the equipment 340 that is installed in the immersion module 300.

As noted above, FIG. 3E illustrates routing of cables 341-1 and 341-2 from the equipment 340-1 and 340-2 along the cable management features 305-1 and out of the immersion module 300 (e.g., to a cable management module such as the cable management module 146 of the hybrid cooling electronic equipment chassis 100, the cable management module 246 of the data center rack 200). While in the example of FIG. 3E, both the cables 341-1 and 341-2 are routed via cable management features 305-1, this is not a requirement. In other embodiments, the cables 341-1 may be routed via cable management features 305-1 while the cables 341-2 are routed via the cable management features 305-2, or vice versa. In still other embodiments, some of the cables 341-1 may be routed via cable management features 305-1 while other ones the cables 341-1 are routed via cable management features 305-2. Similarly, some of the cables 341-2 may be routed via cable management features 305-1 while other ones of the cables 341-2 are routed via cable management features 305-2. Various other combinations are possible.

Figure 4:
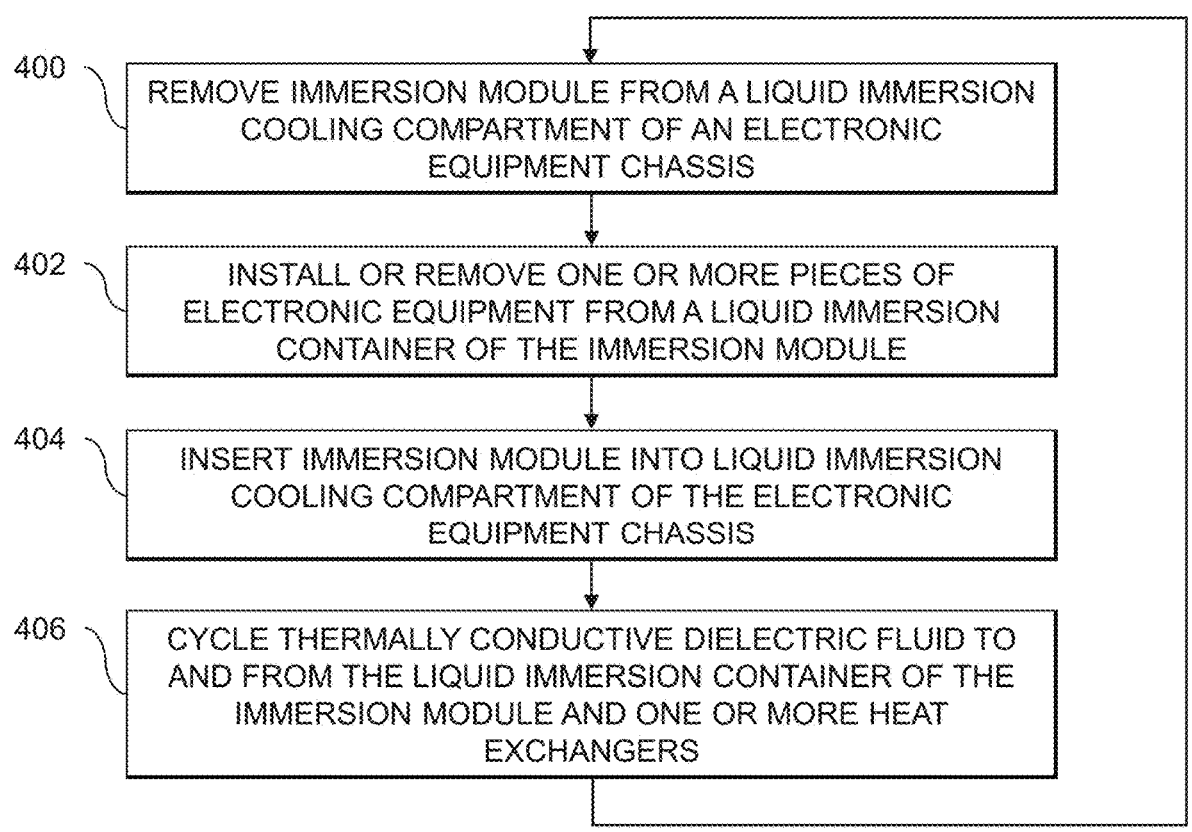
FIG. 4 is a flow diagram of an exemplary process for utilizing an immersion module in a hybrid cooling electronic equipment chassis in an illustrative embodiment.

An exemplary process for utilizing an immersion module in a hybrid cooling electronic equipment chassis will now be described in more detail with reference to the flow diagram of FIG. 4. It is to be understood that this particular process is only an example, and that additional or alternative processes for utilizing an immersion module in a hybrid cooling electronic equipment chassis may be used in other embodiments.

In this embodiment, the process includes steps 400 through 406. In step 400, an immersion module (e.g., immersion module 142, immersion module 242, immersion module 300) is removed from a liquid immersion cooling compartment (e.g., liquid immersion cooling compartments 104, liquid immersion-cooled compartment 204) of an electronic equipment chassis (e.g., hybrid cooling electronic equipment chassis 100, data center rack 200). The immersion module may be removed from the liquid immersion cooling compartment of the electronic equipment chassis by sliding the immersion module along a set of rails (e.g., rails 245, rail guides 307) and guides (e.g., rack integrated guides 243), where the rails may include bearings (e.g., bearings 247) which facilitate such sliding action. The immersion module may also include one or more retractable wheels (e.g., retractable wheels 249, retractable wheels 309) along a bottom surface thereof, again to facilitate rolling of the immersion module along a floor or other surface as it is removed (and inserted) into the liquid immersion cooling compartment of the electronic equipment chassis.

In step 402, one or more pieces of electronic equipment (e.g., equipment 240, equipment 340) are installed or removed from a liquid immersion container of the immersion module. The equipment may be installed into the liquid immersion container along or using sets of equipment mounts (e.g., equipment mounts 303) arranged along an interior perimeter of the liquid immersion container. Once inserted into the equipment mounts, cabling may be routed to and from the electronic equipment installed into the liquid immersion container. Such cable routing may be facilitated via a cable management module (e.g., cable management module 146, cable management module 246) including various features (e.g., cable management features 305, cable ducts 301, etc.) that enable cables to be inserted at various locations along the interior perimeter of the liquid immersion container and routed therethrough to other locations along the interior perimeter of the liquid immersion container or outside of the liquid immersion container. Such cable routing facilitates interconnection of the electronic equipment (e.g., with other electronic equipment installed in the liquid immersion container, with PDUs of the liquid immersion container, with electronic equipment installed in other compartments of the electronic equipment chassis, with electronic equipment external to the electronic equipment chassis, etc.).

Once the electronic equipment is installed or removed from the liquid immersion container of the immersion module in step 402, the immersion module is inserted into the liquid immersion cooling compartment of the electronic equipment chassis in step 404. Thermally conductive dielectric fluid is then cycled to and from the liquid immersion container (e.g., via inlet 311 and outlet 313) of the immersion module and one or more heat exchangers (e.g., internal heat exchanger filter coolant pump 144-1, external heat exchanger filter coolant pump 144-2) in step 406. Processing may then return to step 400 whenever electronic equipment that is installed in the liquid immersion container of the immersion module is to be removed, or whenever electronic equipment is to be installed in the liquid immersion container of the immersion module.

In some embodiments, an electronic equipment chassis comprises a chassis housing and two or more cooling compartments in the chassis housing. At least a first one of the two or more cooling compartments in the chassis housing utilizes a first type of cooling for a first set of electronic equipment housed therein, and at least a second one of the two or more cooling compartments in the chassis housing utilizes a second type of cooling for a second set of electronic equipment housed therein. The first type of cooling comprises liquid immersion cooling and the second type of cooling comprises non-liquid immersion cooling.

In some embodiments, the second type of cooling comprises at least one of air cooling and liquid cooling.

The first cooling compartment may comprise a liquid immersion module, the liquid immersion module comprising a liquid immersion container housing the first set of electronic equipment. The liquid immersion module may be removable from the first cooling compartment. The first cooling compartment may comprise one or more integrated guide rails facilitating insertion and removal of the liquid immersion module. The first cooling compartment may comprise a cable management module configured for routing of one or more cables interconnecting the first set of electronic equipment housed in the liquid immersion container of the liquid immersion module with at least one of the second set of electronic equipment and additional electronic equipment external to the electronic equipment chassis.

The first cooling compartment may further comprise a heat exchange filter coolant pump coupled to the liquid immersion module, the heat exchange filter coolant pump being configured to cycle a thermally conductive dielectric fluid to and from the liquid immersion container and one or more heat exchangers. The first cooling compartment may also or alternatively be coupled to one or more heat exchange filter coolant pumps external to the electronic equipment chassis, the one or more heat exchange filter coolant pumps being configured to cycle a thermally conductive dielectric fluid to and from the liquid immersion container and one or more heat exchangers.

The first set of electronic equipment may comprise one or more computing devices, such as one or more rackmount servers.

In some embodiments, a liquid immersion module comprises a liquid immersion container configured to house a set of electronic equipment, one or more rail guides coupled to the liquid immersion container, the one or more rail guides configured for facilitating insertion and removal of the liquid immersion module from a liquid immersion cooling compartment of an electronic equipment chassis, and one or more cable management features configured for routing of one or more cables interconnecting the set of electronic equipment in the liquid immersion container with additional electronic equipment external to the electronic equipment chassis.

The liquid immersion module may further comprise one or more inlet ports and one or more outlet ports coupled to the liquid immersion container, wherein the one or more inlet ports and one or more outlet ports are configured to cycle a thermally conductive dielectric fluid through the liquid immersion container to provide cooling of the set of electronic equipment.

The liquid immersion module may also or alternatively comprise one or more retractable wheels coupled to a bottom of the liquid immersion container.

The liquid immersion module may further or alternatively comprise a set of equipment mounts coupled to interior sidewalls of the liquid immersion container, the set of equipment mounts providing mounting features for holding the set of electronic equipment in place within the liquid immersion container.

In some embodiments, the liquid immersion module further comprises one or more PDUs providing power to the set of equipment housed in the liquid immersion container.

The one or more cable management features may comprise one or more cable ducts running along at least a portion of an interior perimeter of the liquid immersion container. The one or more cable ducts may comprise a plurality of openings enabling routing of one or more cables between first and second locations along the interior perimeter of the liquid immersion container.

In some embodiments, an electronic equipment rack comprises at least one electronic equipment chassis comprising a chassis housing with two or more cooling compartments including at least a first cooling compartment utilizing liquid immersion cooling for a first set of electronic equipment and at least a second cooling compartment utilizing non-liquid immersion cooling for a second set of electronic equipment. The electronic equipment rack also comprises at least one liquid immersion module configured for insertion into and removal from the at least one cooling compartment of the at least one electronic equipment chassis, the at least one liquid immersion module comprising at least one liquid immersion container configured to house the first set of electronic equipment.

The electronic equipment rack may further comprise one or more integrated guides in the first cooling compartment configured to mate with one or more rails on an exterior of the at least one liquid immersion module, the one or more rails being configured to slide along the one or more integrated guides to facilitate insertion and removal of the at least one liquid immersion module from the first cooling compartment.

The electronic equipment rack may further comprise one or more cable management features configured for routing of one or more cables interconnecting the first set of electronic equipment with at least one of: the second set of electronic equipment; and additional electronic equipment external to the at least one electronic equipment chassis.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

It should again be emphasized that the above-described embodiments are presented for purposes of illustration only. Many variations and other alternative embodiments may be used. For example, the disclosed techniques are applicable to a wide variety of other types of electronic equipment, electronic equipment chassis, cooling methods, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An electronic equipment chassis comprising:
a chassis housing; and
two or more cooling compartments in the chassis housing;
wherein at least a first one of the two or more cooling compartments in the chassis housing utilizes a first type of cooling for a first set of electronic equipment housed therein;
wherein at least a second one of the two or more cooling compartments in the chassis housing utilizes a second type of cooling for a second set of electronic equipment housed therein; and
wherein the first type of cooling comprises liquid immersion cooling and the second type of cooling comprises non-liquid immersion cooling;
wherein the first one of the two or more cooling compartments comprises a cable management module configured for routing of one or more cables interconnecting the first set of electronic equipment housed in the first one of the two or more cooling compartments with at least one of the second set of electronic equipment and additional electronic equipment external to the electronic equipment chassis;
wherein the cable management module comprises a first set of one or more cable management features disposed on an interior perimeter of a first edge of the first one of the two or more cooling compartments and a second set of one or more cable management features disposed on an interior perimeter of a second edge of the first one of the two or more cooling compartments;
wherein the first set of one or more cable management features comprises a plurality of openings;
wherein the second set of one or more cable management features comprises at least one cable duct; and
wherein at least one of the one or more cables is routed from the first set of electronic equipment through at least one of the plurality of openings and the at least one cable duct to said at least one of the second set of electronic equipment and the additional electronic equipment external to the electronic equipment chassis.

2. The electronic equipment chassis of claim 1 wherein the second type of cooling comprises at least one of air cooling and liquid cooling.

3. The electronic equipment chassis of claim 1 wherein the first one of the two or more cooling compartments comprises a liquid immersion module, the liquid immersion module comprising a liquid immersion container housing the first set of electronic equipment.

4. The electronic equipment chassis of claim 3 wherein the liquid immersion module is removable from the first one of the two or more cooling compartments.

5. The electronic equipment chassis of claim 4 wherein the first one of the two or more cooling compartments comprises one or more integrated guide rails facilitating insertion and removal of the liquid immersion module.

6. The electronic equipment chassis of claim 3 wherein the first one of the two or more cooling compartments further comprises a heat exchange filter coolant pump coupled to the liquid immersion module, the heat exchange filter coolant pump being configured to cycle a thermally conductive dielectric fluid to and from the liquid immersion container and one or more heat exchangers.

7. The electronic equipment chassis of claim 3 wherein the first one of the two or more cooling compartments is coupled to one or more heat exchange filter coolant pumps external to the electronic equipment chassis, the one or more heat exchange filter coolant pumps being configured to cycle a thermally conductive dielectric fluid to and from the liquid immersion container and one or more heat exchangers.

8. The electronic equipment chassis of claim 1 wherein the first set of electronic equipment comprises one or more computing devices.

9. The electronic equipment chassis of claim 8 wherein the one or more computing devices comprise one or more rackmount servers.

10. The electronic equipment chassis of claim 1 wherein the plurality of openings comprise slots.

11. The electronic equipment chassis of claim 1 wherein the plurality of openings comprise finger-like ducts.

12. An electronic equipment rack comprising:
- at least one electronic equipment chassis comprising a chassis housing with two or more cooling compartments including at least a first one of the two or more cooling compartments utilizing liquid immersion cooling for a first set of electronic equipment and at least a second one of the two or more cooling compartments utilizing non-liquid immersion cooling for a second set of electronic equipment; and
- at least one liquid immersion module configured for insertion into and removal from the first one of the two or more cooling compartments of the at least one electronic equipment chassis, the at least one liquid immersion module comprising at least one liquid immersion container configured to house the first set of electronic equipment;
- wherein the first one of the two or more cooling compartments comprises a cable management module configured for routing of one or more cables interconnecting the first set of electronic equipment housed in the at least one liquid immersion container with at least one of the second set of electronic equipment and additional electronic equipment external to the electronic equipment chassis;
- wherein the cable management module comprises a first set of one or more cable management features disposed on an interior perimeter of a first edge of the first one of the two or more cooling compartments and a second set of one or more cable management features disposed on an interior perimeter of a second edge of the first one of the two or more cooling compartments;
- wherein the first set of one or more cable management features comprises a plurality of openings;
- wherein the second set of one or more cable management features comprises at least one cable duct; and
- wherein at least one of the one or more cables is routed from the first set of electronic equipment through at least one of the plurality of openings and the at least one cable duct to said at least one of the second set of electronic equipment and the additional electronic equipment external to the at least one electronic equipment chassis.

13. The electronic equipment rack of claim 12 further comprising one or more integrated guides in the first one of the two or more cooling compartments configured to mate with one or more rails on an exterior of the at least one liquid immersion module, the one or more rails being configured to slide along the one or more integrated guides to facilitate insertion and removal of the at least one liquid immersion module from the first one of the two or more cooling compartments.

14. The electronic equipment rack of claim 12 wherein the plurality of openings comprise slots.

15. The electronic equipment rack of claim 12 wherein the plurality of openings comprise finger-like ducts.

16. The electronic equipment rack of claim 12 wherein the non-liquid immersion cooling comprises at least one of air cooling and liquid cooling.

17. The electronic equipment rack of claim 12 wherein the first one of the two or more cooling compartments further comprises a heat exchange filter coolant pump coupled to the at least one liquid immersion module, the heat exchange filter coolant pump being configured to cycle a thermally conductive dielectric fluid to and from the at least one liquid immersion container and one or more heat exchangers.

18. The electronic equipment rack of claim 12 wherein the first one of the two or more cooling compartments is coupled to one or more heat exchange filter coolant pumps external to the at least one electronic equipment chassis, the one or more heat exchange filter coolant pumps being configured to cycle a thermally conductive dielectric fluid to and from the at least one liquid immersion container and one or more heat exchangers.

19. The electronic equipment rack of claim 12 wherein the first set of electronic equipment comprises one or more computing devices.

20. The electronic equipment rack of claim 19 wherein the one or more computing devices comprise one or more rackmount servers.

* * * * *